(12) United States Patent
Kwak

(10) Patent No.: US 7,547,626 B2
(45) Date of Patent: Jun. 16, 2009

(54) SEMICONDUCTOR PACKAGE AND METHOD OF FORMING WIRE LOOP OF SEMICONDUCTOR PACKAGE

(75) Inventor: Byung-kil Kwak, Seongnam-si (KR)

(73) Assignee: Samsung Techwin Co., Ltd., Changwon (KR)

( * ) Notice: Subject to any disclaimer, the term of this patent is extended or adjusted under 35 U.S.C. 154(b) by 40 days.

(21) Appl. No.: 11/825,713

(22) Filed: Jul. 9, 2007

(65) Prior Publication Data

US 2008/0099895 A1 May 1, 2008

(30) Foreign Application Priority Data

Oct. 27, 2006 (KR) ...................... 10-2006-0105038

(51) Int. Cl.
*H01L 21/4763* (2006.01)
(52) U.S. Cl. .............................. 438/617; 257/E23.024; 228/180.5
(58) Field of Classification Search ................ 438/617; 228/180.5; 257/E23.024
See application file for complete search history.

(56) References Cited

U.S. PATENT DOCUMENTS

| 6,222,274 B1 * | 4/2001 | Nishiura et al. ............. 257/776 |
| 6,391,759 B1 * | 5/2002 | Chao et al. .................. 438/617 |
| 6,933,608 B2 * | 8/2005 | Fujisawa .................... 257/738 |
| 2002/0056924 A1 * | 5/2002 | Chung et al. ................ 257/784 |

* cited by examiner

*Primary Examiner*—David A Zarneke
*Assistant Examiner*—Jenny L Wagner
(74) *Attorney, Agent, or Firm*—Drinker Biddle & Reath LLP

(57) ABSTRACT

Provided are a semiconductor package and a method of forming a wire loop of the semiconductor package. The semiconductor package includes: at least one semiconductor chip; a lead frame including a plurality of leads; and a plurality of wire loops, the wire loops connecting an electrode pad of the semiconductor chip to the leads. Wire loops include: a ball connected to the electrode pad; a pressed part formed on an upper surface of the ball by pressing the wire to overlap two parts of the wire; a first wire part extending substantially horizontally from the pressed part and including at least a portion contacting an upper surface of the semiconductor chip; a second wire part extending at a downward incline from the first wire part; and a third wire part extending from the second wire part and including an end connected to one of the leads.

15 Claims, 12 Drawing Sheets

US 7,547,626 B2

SEMICONDUCTOR PACKAGE AND METHOD OF FORMING WIRE LOOP OF SEMICONDUCTOR PACKAGE

CROSS-REFERENCE TO RELATED PATENT APPLICATION

This application claims the benefit of Korean Patent Application No. 10-2006-0105038, filed on Oct. 27, 2006, in the Korean Intellectual Property Office, the disclosure of which is incorporated herein in its entirety by reference.

BACKGROUND OF THE INVENTION

1. Field of the Invention

The present invention relates generally to a semiconductor package. More particularly, the present invention relates to a method of forming a wire loop for a semiconductor package.

2. Description of the Related Art

To connect an internal circuit of a semiconductor chip to an external circuit, a wire bonding process is performed. During the wire bonding process, electrode pads on an upper surface of a semiconductor chip are connected to leads of a lead frame through conductive wires. In more detail, the wire bonding process is performed to bond the conductive wires to the electrode pads and the leads by applying heat, ultrasonic waves, etc. while the conductive wires are being pressed against the electrode pads and the leads.

As is known in the art, a capillary equipped with one or more wires is lowered towards an electrode pad to press an end of a wire on a bonding surface so as to perform first bonding. Thereafter, the capillary is moved to a lead of the lead frame, thereby extending the wire, in order to press the opposite end of the wire against the lead so as to perform second bonding. Typically, before the first bonding is performed, a ball having a round shape is formed at the end of the wire which is to be bonded. FIG. 1 illustrates a portion of a wire 10 having a ball 11 formed at an end thereof.

To form the ball 11, the end of the wire 10 is made molten, for example by a spark discharge induced by applying a high voltage between the end of the wire 10 and a discharge electrode adjacent to the end of the wire 10. Because a high heat is generated by the spark discharge when the ball 11 is formed, a portion of the wire 10 adjacent to the ball 11 is adversely affected (e.g., annealed or otherwise hardened due to the high heat). Reference character "HAZ" denotes a heat affected zone that is caused during formation of the ball 11. A physical value (e.g., ductility) of the wire material is changed due to a thermal deformation. Thus, it is difficult to curve or bend the HAZ portion of the wire 10.

FIG. 2 is a view schematically illustrating the wire 10 having the ball 11 formed at an end thereof and which is bonded to an electrode pad 12.

The ball 11 that is formed at the end of the wire 10 is pressed on the electrode pad 12 and bonded thereto (e.g., under predetermined heat and appropriate pressure). After bonding the ball 11 to the electrode pad 12, the wire 10 is extended in a forward direction (i.e., toward a lead of the lead frame) so that the wire 10 has a predetermined loop shape. As shown in FIG. 2, reference character $H_{L1}$ denotes a neck height. Neck height $H_{L1}$ is a measurement of a height of the wire 10 standing upwards from the electrode pad 12, or a height of a loop from a bottom surface of the ball 11 to a top of the wire 10. As can be appreciated, it may be difficult to reduce a value of the neck height $H_{L1}$ since a typical dimension of a HAZ portion of a wire is about 100 μm or more and because it may be difficult to curve or bend the HAZ portion.

In this case, a height or thickness of a semiconductor package is increased. Furthermore, in this case a short-circuit may occur between upper and lower wires in the case of a multi-layer multi-chip.

Accordingly, in an attempt to solve the above challenges, a wire loop having a ball neckless loop (BNL) shape as shown in FIG. 3 has been developed.

FIG. 3 is a view schematically illustrating a semiconductor package including a conventional wire loop having a BNL shape. As shown in FIG. 3, a semiconductor chip 21, which includes an electrode pad 21a on its upper surface, is disposed on a die pad 22a of a lead frame 22.

An end of a wire that includes a ball 23a is pressed on the electrode pad 21. A portion of the wire proximate the ball 23a is then pressed to fold or overlap a portion thereof so as to form a pressed part 23b on the ball 23a. The wire is extended toward a lead 22b of the lead frame 22 and another end of the wire is connected to the lead 22b to complete the formation of the wire loop 23.

However, if a difference in a height between the electrode pad 21a and the lead 22 is small or a state of the lead 22b is poor, a repelling force that is generated at the lead 22b during bonding may be applied on the wire loop 23. Thus, the wire loop 23 is repelled in a vertical direction. As a result, a height of a loop is not uniform and is difficult to be kept low.

SUMMARY OF THE INVENTION

According to one aspect of the present invention, there is provided a semiconductor package comprising: at least one semiconductor chip including a plurality of electrode pads; a lead frame including a plurality of leads; and a plurality of wire loops, wherein wire loops of the plurality may include a ball that is bonded to an electrode pad of the plurality of electrode pads; a pressed part on an upper surface of the ball, a first wire part that extends substantially horizontally from the pressed part and which contacts an upper surface of the semiconductor chip, a second wire part that extends downward from the first wire part; and a third wire part that extends from the second wire part and which has an end connected to a lead of the plurality of leads. The third wire part may include a first portion that extends horizontally and upward, and a second portion (e.g., a fourth wire part) that extends horizontally and downward.

An insulator may be formed on at least a portion of the upper surface of the semiconductor chip to provide electrical insulation between the upper surface of the semiconductor chip and the first wire part.

A first curved part or bend may be formed between the first and second wire parts. A second curved part or bend may be formed between the second and third wire parts. A third curved part or bend may optionally be formed between the first and second portions of the third wire part.

According to another aspect of the present invention, there is provided a method of forming a wire loop of a semiconductor package that includes at least one semiconductor chip with a plurality of electrode pads and a lead frame with a plurality of leads, the method comprising: bonding a ball to an electrode pad of the plurality; forming a folded portion on an upper surface of the ball; forming a first curved part at a first predetermined distance from the pressed part; forming a second curved part at a second predetermined distance from the first curved part; extending the wire a third predetermined distance from the second curved part; and connecting a wire end to a lead of the plurality. The method may further include the step of configuring an insulator between an upper surface of the semiconductor chip and a portion of the wire between the pressed part and the first curved part.

The step of forming a folded portion may include the steps of: folding a portion of the wire proximate to the ball; and pressing the folded portion downward onto the ball. The connecting step may include the step of arcuately moving the wire end to the lead so that a portion of the wire from the pressed part to the first curved part is configured to be substantially horizontal and contacting an upper surface of the semiconductor chip. Before the connecting step, the method may further include the steps of: extending the wire a fourth predetermined distance from the second curved part; and forming a third curved part. The step of forming a third curved part may further include the steps of: moving the wire end downward and toward the electrode pad; and moving the wire end upward and toward the lead.

DETAILED DESCRIPTION OF THE EMBODIMENTS

Figure 1:
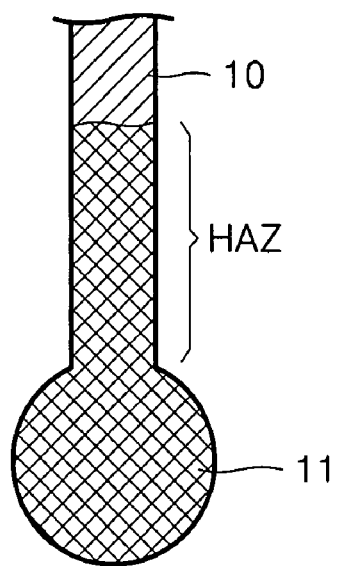
FIG. 1 is a view illustrating a wire having an end at which a ball is formed.
Figure 2:
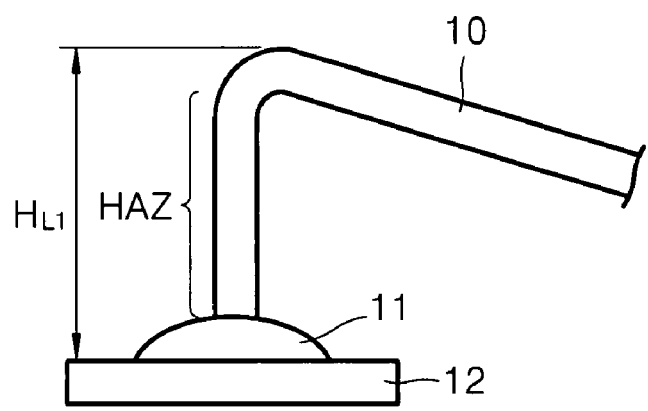
FIG. 2 is a view schematically illustrating a shape of a bonded portion of a wire according to the prior art.
Figure 3:
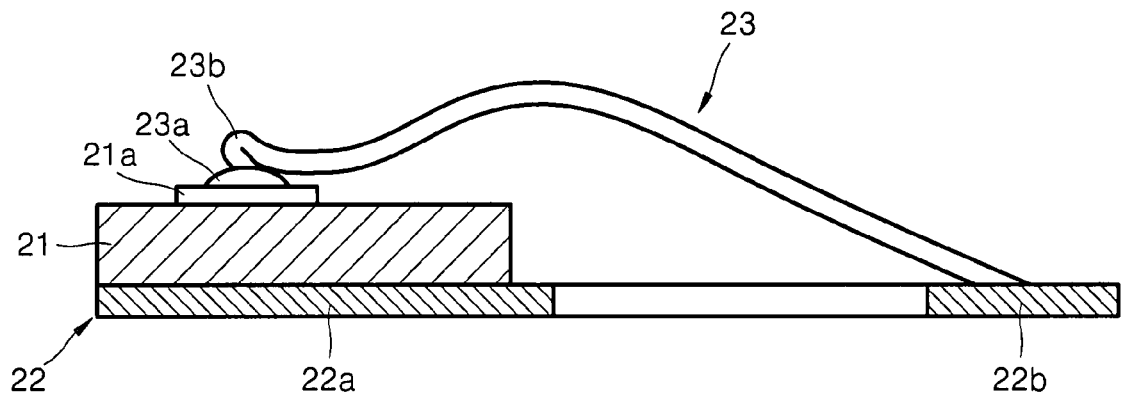
FIG. 3 is a view schematically illustrating a semiconductor package including a conventional wire loop having a ball neckless loop (BNL) shape.
Figure 4:
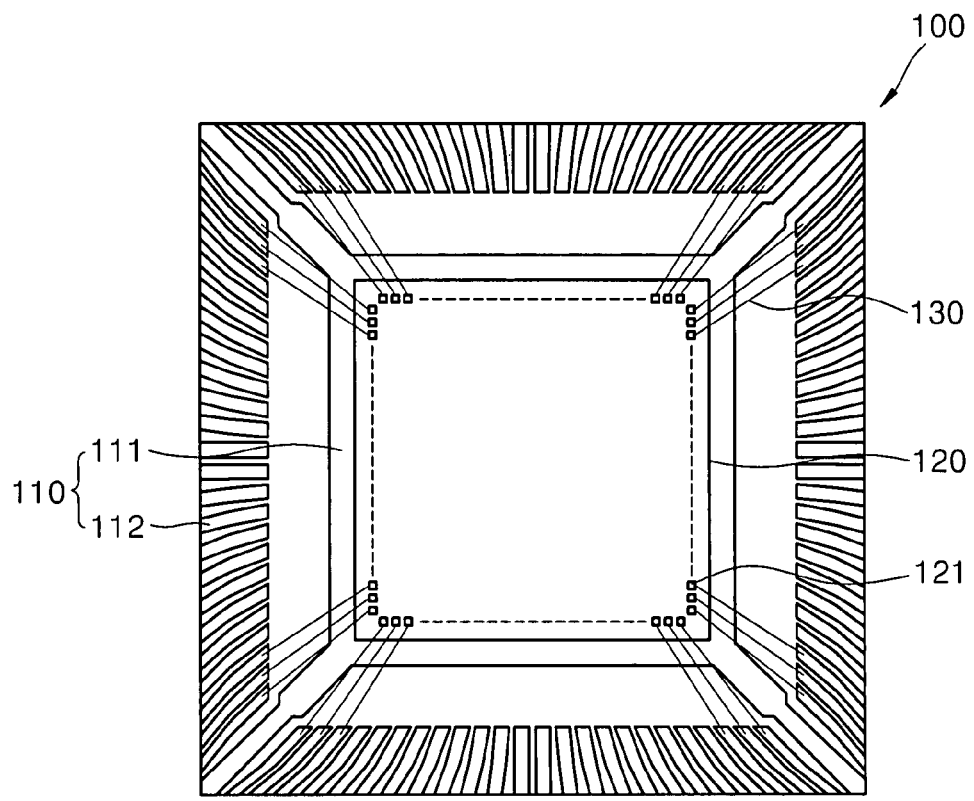
FIG. 4 is a plan view schematically illustrating a portion of a semiconductor package according to an aspect of the present invention.
Figure 5:
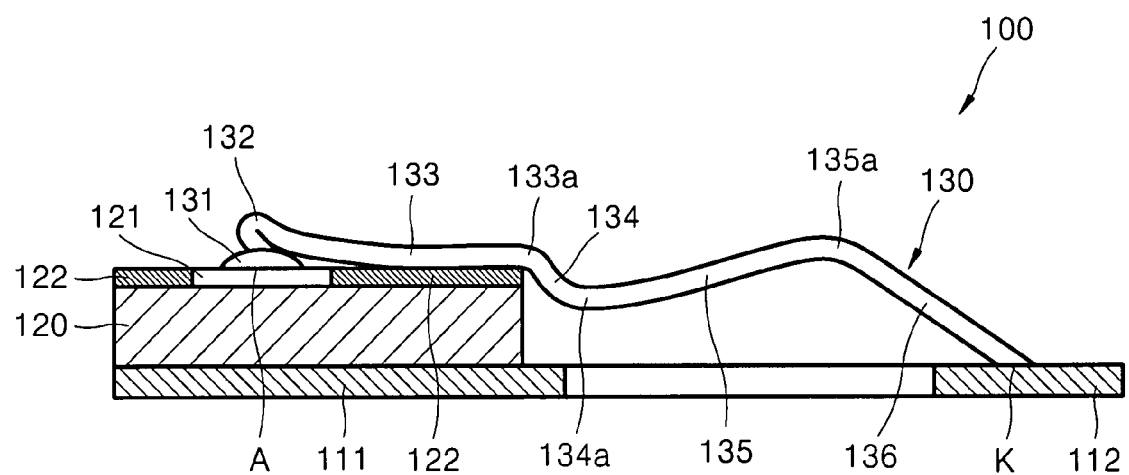
FIG. 5 is a cross-sectional elevation view illustrating a portion of the semiconductor package of FIG. 4.

FIG. 4 is a plan view schematically illustrating a portion of a semiconductor package according to an embodiment of the present invention, and FIG. 5 is a cross-sectional view illustrating a portion of the semiconductor package illustrated in FIG. 4. Referring to FIGS. 4 and 5, a semiconductor package 100 includes a lead frame 110, a semiconductor chip 120, and a plurality of wire loops 130.

The lead frame 110 includes a die pad 111 and a plurality of leads 112. The semiconductor chip 120 is disposed on the die pad 111.

As shown, the semiconductor chip 120 includes a plurality of electrode pads 121 configured about a perimeter of an upper surface of the semiconductor chip 120. As best shown in FIGS. 5-17, an insulator 122 may be disposed, applied or otherwise configured on portions of the upper surface of the semiconductor chip 120 such that the insulator 122 does not overlap or cover the electrode pads 121.

As shown in FIG. 5, at least one first embodiment of wire loop 130 of the plurality includes a ball 131, a pressed part 132, a first wire part 133, a second wire part 134, a third wire part 135, and a fourth wire part 136. However, as can be appreciated from FIG. 19, a wire loop may be configured without the fourth wire part 136. Accordingly, although the third wire part 235 (FIG. 19) is shown as being generally linear in shape, the third wire part 235 may alternatively include a first portion (e.g., a generally upwardly-inclined portion such as the third wire part 135) and a second portion (e.g., a generally downwardly-inclined portion such as the fourth wire part 136).

To form the wire loop 130, the ball 131 is bonded (e.g., made molten by high voltage discharge, etc.) to a first bonding point "A" of an upper surface of an electrode pad 121 of the plurality. After bonding the ball 131, a portion of the wire proximate to the ball 131 is pressed, kinked or folded to overlap two portions thereof (i.e., folding the wire back on itself) so as to form the pressed part 132 on the ball 131.

The first wire part 133 extends substantially horizontally from the pressed part 132, and at least a portion of the first wire part 133 contacts the insulator 122 of the semiconductor chip 120.

Although the insulator 122 is shown as being applied, disposed or otherwise configured on one or more portions of the upper surface of the semiconductor chip 120, the present invention is not limited to this configuration. The insulator 122 may be configured, for example only on the portions of the upper surface of the semiconductor chip 120 which contact the first wire part 133 (i.e., only at an edge of the upper surface of the semiconductor chip 120 outside the electrode pad 121). Furthermore, the insulator may alternatively or additionally be configured on a portion of the first wire part 133. For example, by coating a portion of the first wire part 133 with an insulating material, the illustrated insulator 122 may not be included.

The second wire part 134 extends at a downward incline from the first wire part 133 and is connected to the first wire part 133 through a first curved or bent part 133a. Although the first and second wire parts 133, 134 are described as being connected, it should be appreciated that the parts 133, 134 may be integrally formed, continuous or otherwise unitary.

The third wire part 135 extends at an upward incline from the second wire part 134 and is connected to the second wire part 134 through a second curved part 134a. Although the second and third wire parts 134, 135 are described as being connected, it should be appreciated that the parts 134, 135 may be integrally formed, continuous or otherwise unitary.

The third wire part 135 according to the presently-described embodiment inclines upward from the second wire part 134. However, wire loops herein are not limited to this configuration. In other words, the third wire part 135 does not need to incline upward from the second wire part 134. For example, the third wire part 135 may extend substantially horizontally from the second wire part 134 (see, for example, the third wire part 235 shown in FIG. 19) or be configured otherwise to have a low height.

The optional fourth wire part 136 (or second portion of the third wire part 135) extends at a downward incline from the third wire part 135 and is connected to the third wire part 135 through a third curved part 135a. Although the third and fourth wire parts 135, 136 are described as being connected, it should be appreciated that the parts 135, 136 may be integrally formed, continuous or otherwise unitary.

A wire end (i.e., a free end of the fourth wire part 136 that is opposite to the end of the fourth wire part 136 that is connected to the third wire part 135) is bonded to the lead 112 at a second bonding point K.

Since wire loops (e.g., the wire loop 130 according to the present embodiment) made by a method, which will be described hereinafter, include the pressed part 132 (or 232, FIG. 19), the first wire part 133 (or 233, FIG. 19), the first curved part 133a (or 233a, FIG. 19), the second wire part 134 (or 234, FIG. 19), and the second curved part 134a (or 234a, FIG. 19), the first wire part 133 (or 233, FIG. 19) contacts the upper surface of the semiconductor chip 120. Thus, a loop shape having a low height is provided. Furthermore, since the wire loop 130, 230 is supported in part by the upper surface of the semiconductor chip 120, the wire loop 130, 230 can be stably realized.

A wire bonding method for forming the wire loop 100 according to an aspect of the present invention will now be described with reference to FIGS. 6 through 17.

FIGS. 6 through 17 are views illustrating stepwise movement of a capillary 140 during a process of forming a wire loop in a predetermined shape. Although the Figures show the semiconductor package being generally horizontally configured during formation of the wire loop 130, 230, the semiconductor package may alternatively be configured vertically, at various acute or obtuse angles with the horizontal or even upside-down relative to the illustrated orientation. To this end, it should be appreciated that the directional terms used herein, including but not limited to upward, upwardly, downward, downwardly, right, rightward, left and leftward, are used for convenience of description with reference to the Figures and are not intended to be limiting on the method or a semiconductor package with a wire loop made thereby.

Initially, an end of a wire material 130' is formed into a ball shape. For example, an end of the wire material 130' may be fed from or otherwise extend a short distance from the capillary 140 and then an electric discharge may occur proximate to the end of the wire material 130' to generate heat. Consequently, the end of the wire material 130' is made molten by the generated heat to form a ball 131.

Figure 6:
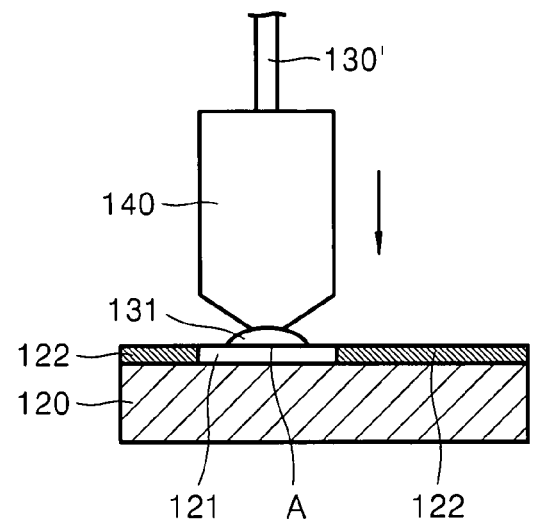
FIGS. 6 through 17 are cross-sectional elevation views illustrating a process of forming the wire loop of FIG. 5 according to another aspect of the present invention.

As shown in FIG. 6, the capillary 140 is positioned over an electrode pad 121 of the plurality and the capillary 140 is moved downward to bond the ball 131 on the electrode pad 121 so as to perform the first bonding at the first bonding point A.

Figure 7:
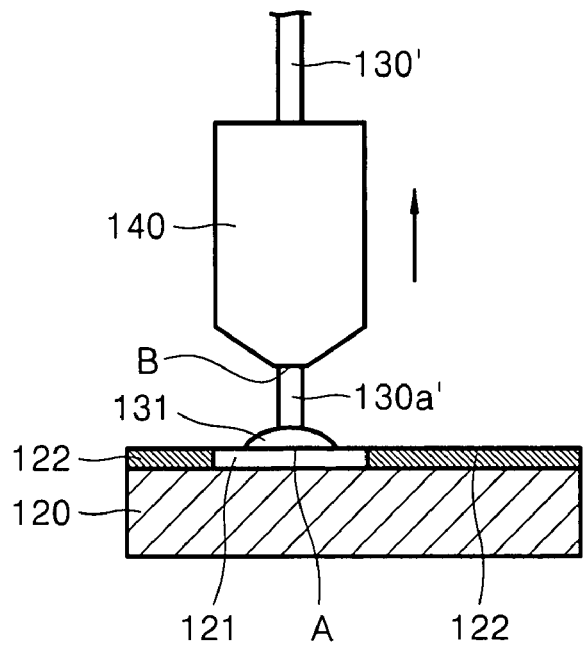

As shown in FIG. 7, the capillary 140 is moved upwardly or raised from the first bonding point A to a loop point B to expose a wire material 130a' having a predetermined length under the capillary 140.

Figure 8:
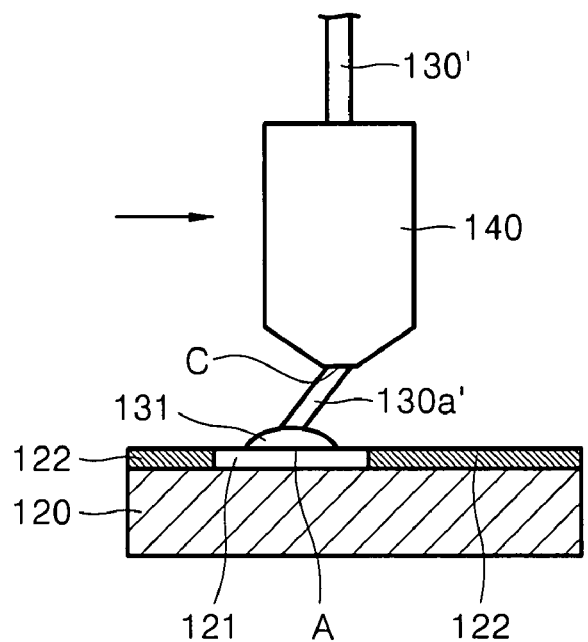

As shown in FIG. 8, the capillary 140 is moved in a substantially horizontal right direction to a loop point C, wherein the right direction is a direction towards the second bonding point K (i.e., a lead 112 of the lead frame 110). At loop point C, the wire material 130a' extends at an upward angle from the ball 131.

Figure 9:
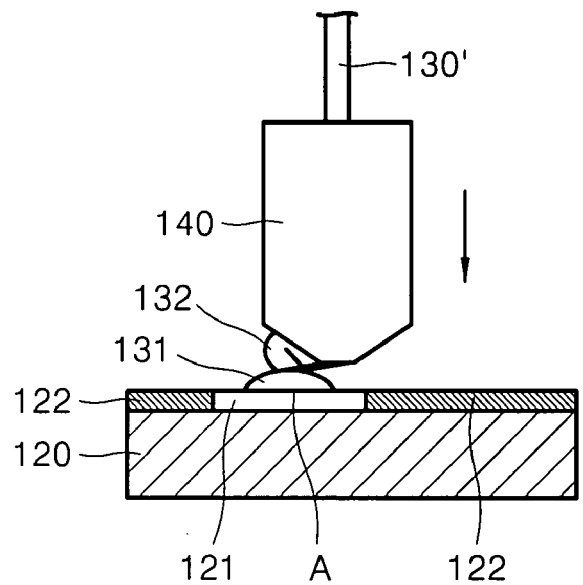

As shown in FIG. 9, the capillary 140 is again moved downwards to press the capillary 140 at the first bonding point A so as to fold the wire material 130a' back on itself or otherwise overlap portions of the wire material 130a'. As a result, the pressed part 132 is formed.

Figure 10:
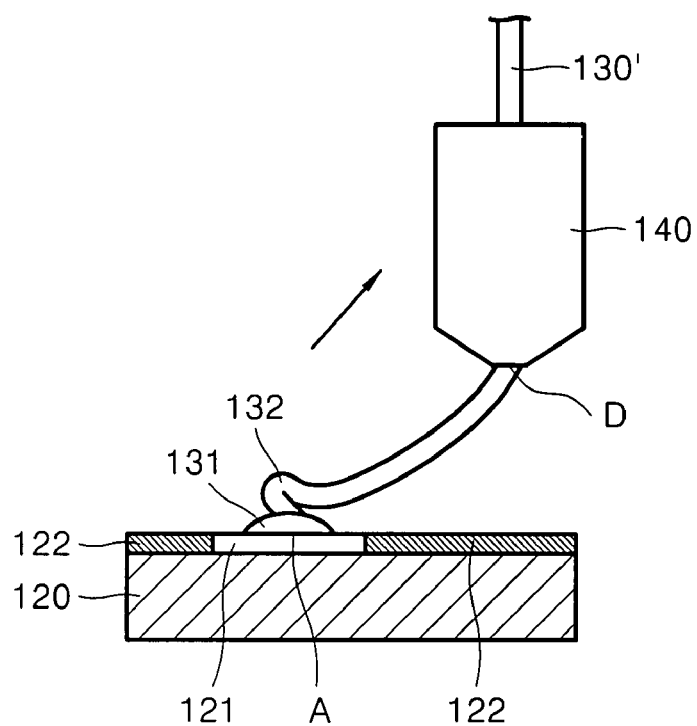

As shown in FIG. 10, the capillary 140 is moved from loop point C in a substantially linear rightward and upward direction to a loop point D to expose an additional predetermined length of the wire material under the capillary 140.

Figure 11:
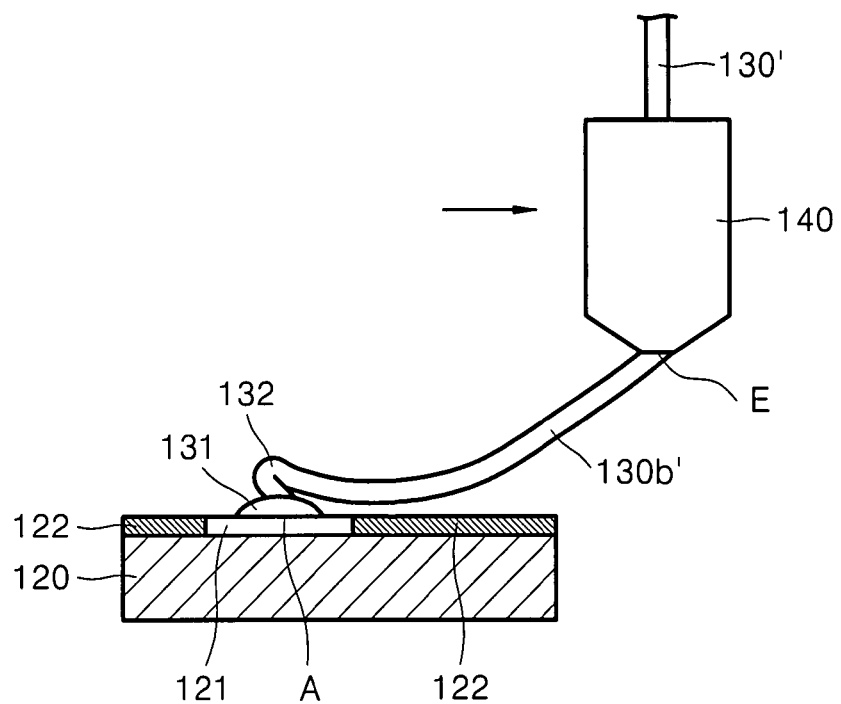

As shown in FIG. 11, the capillary 140 is moved from loop point D in a rightward direction to a loop point E to expose additional wire material under the capillary 140. The totally exposed wire material 130b', which results from moving the capillary 140 from loop point C to loop point E, inclines upwardly to the right and most of the wire material 130b' corresponds to the first wire part 133 (FIG. 5).

Figure 12:
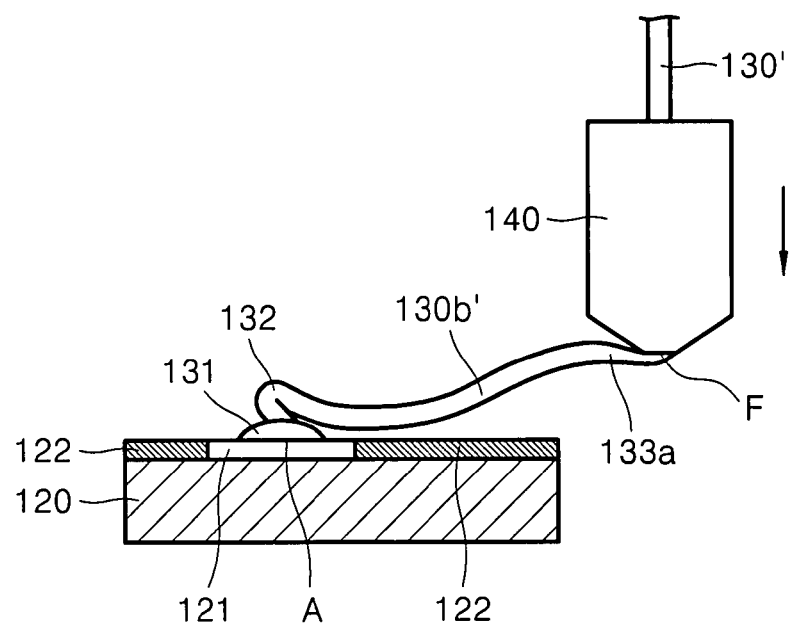

As shown in FIG. 12, the capillary 140 is moved downward from loop point E to a loop point F to form a convex curve or bend (i.e., curving outward or away from the semiconductor chip 120) in the wire material 130b' so as to form the first curved or bent part 133a.

Figure 13:
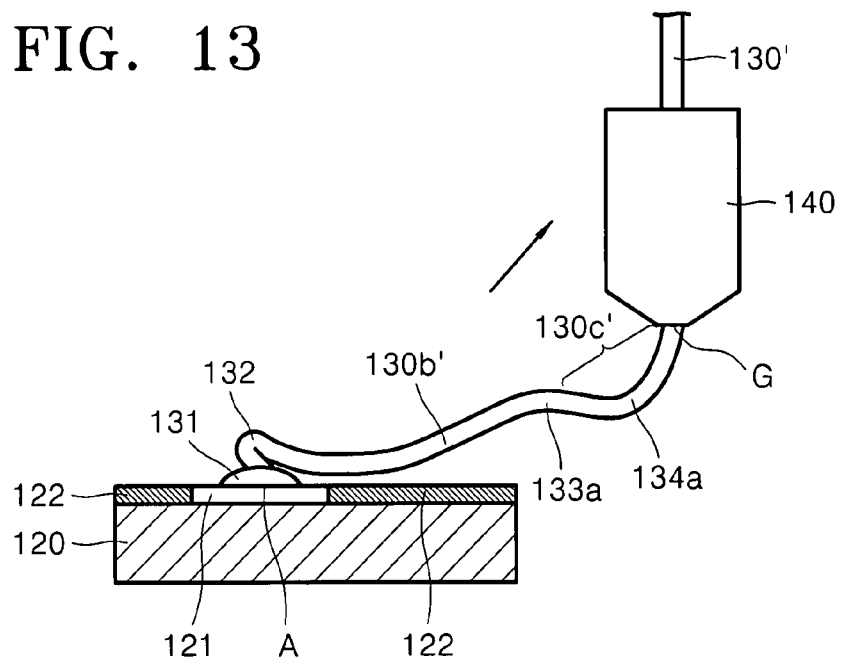

As shown in FIG. 13, the capillary 140 is moved from loop point F in a generally linear rightward and upward direction to a loop point G to expose a wire material 130c' having a predetermined length and a concave bend or curve (i.e., curving inward or toward the semiconductor chip 120) under the capillary 140. Here, most of the exposed wire material 130c' corresponds to the second wire part 134 and the second curved part 134a (see FIG. 5).

Figure 14:
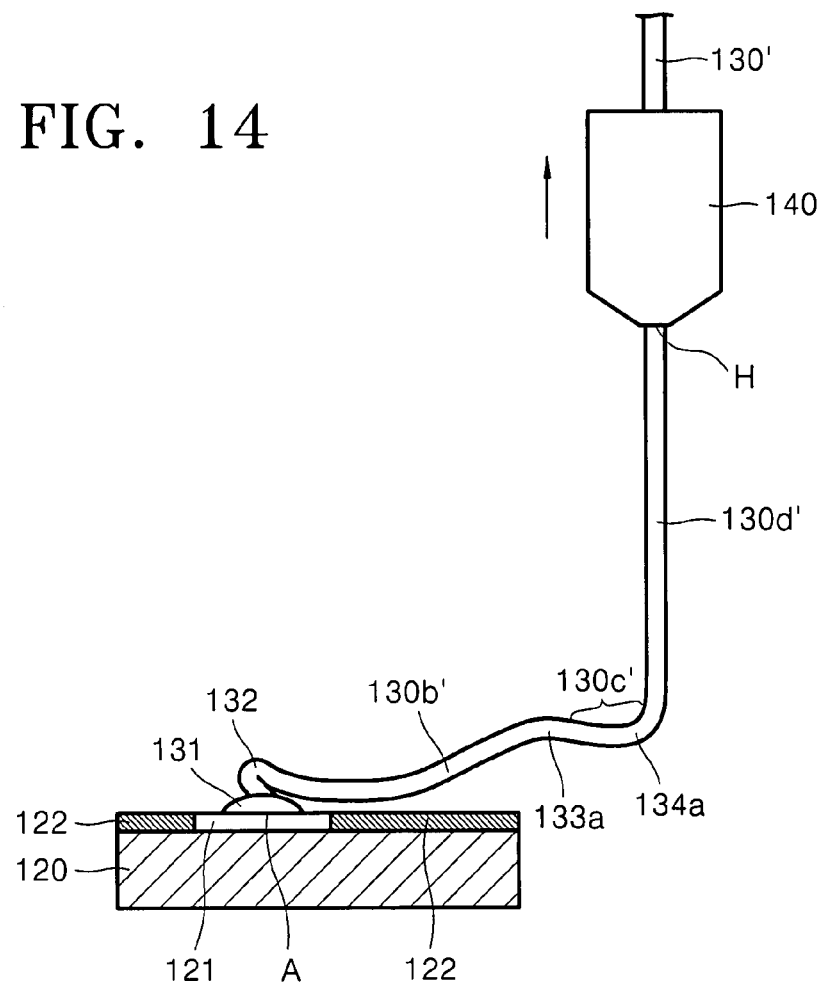

As shown in FIG. 14, the capillary 140 is moved upwardly from loop point G to a loop point H to expose a wire material 130d' having a predetermined length in a vertical direction under a lower part of the capillary 140. Here, most of the exposed wire material 130d' corresponds to the third wire part 135.

Figure 15:
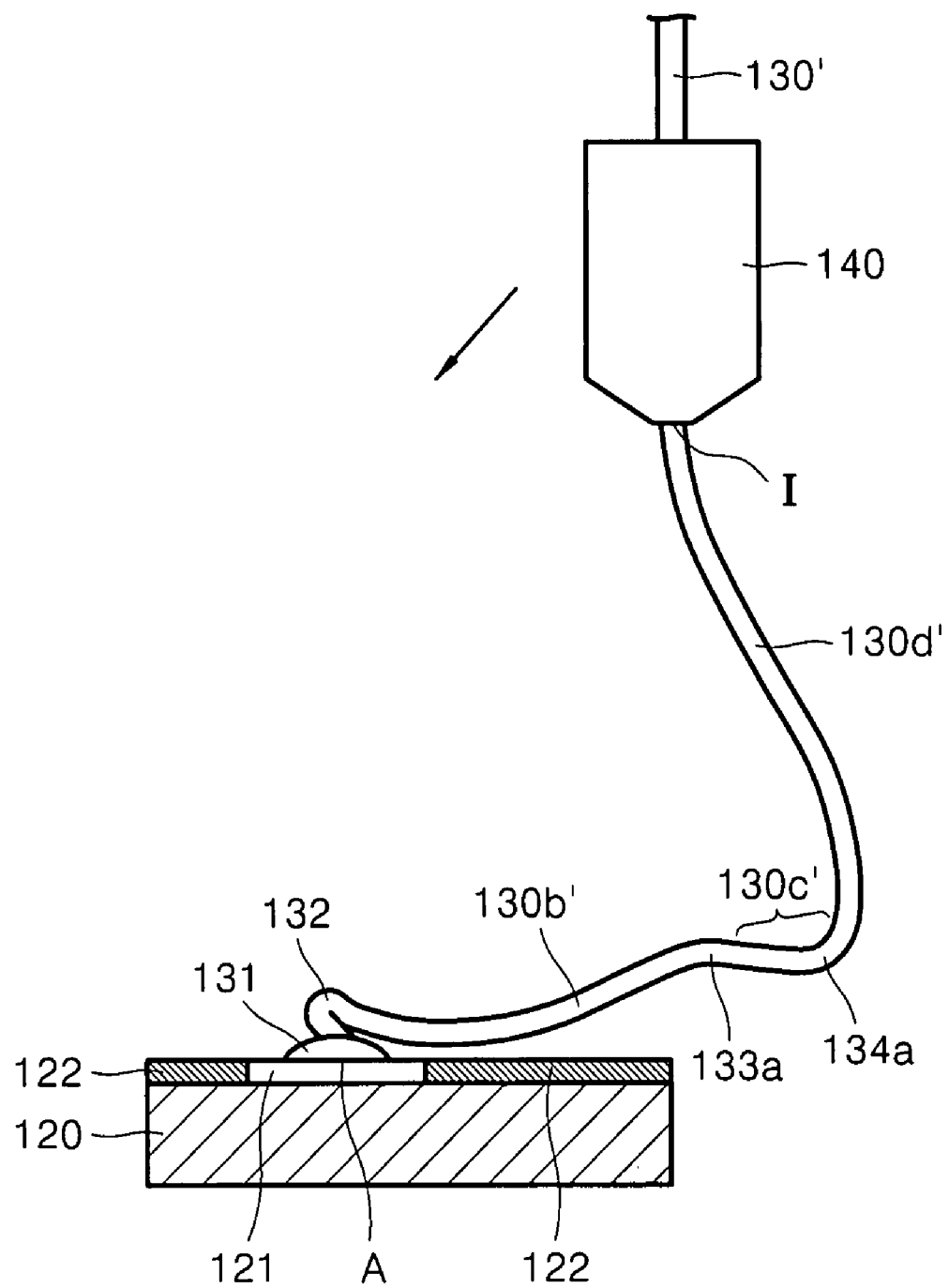
Figure 16:
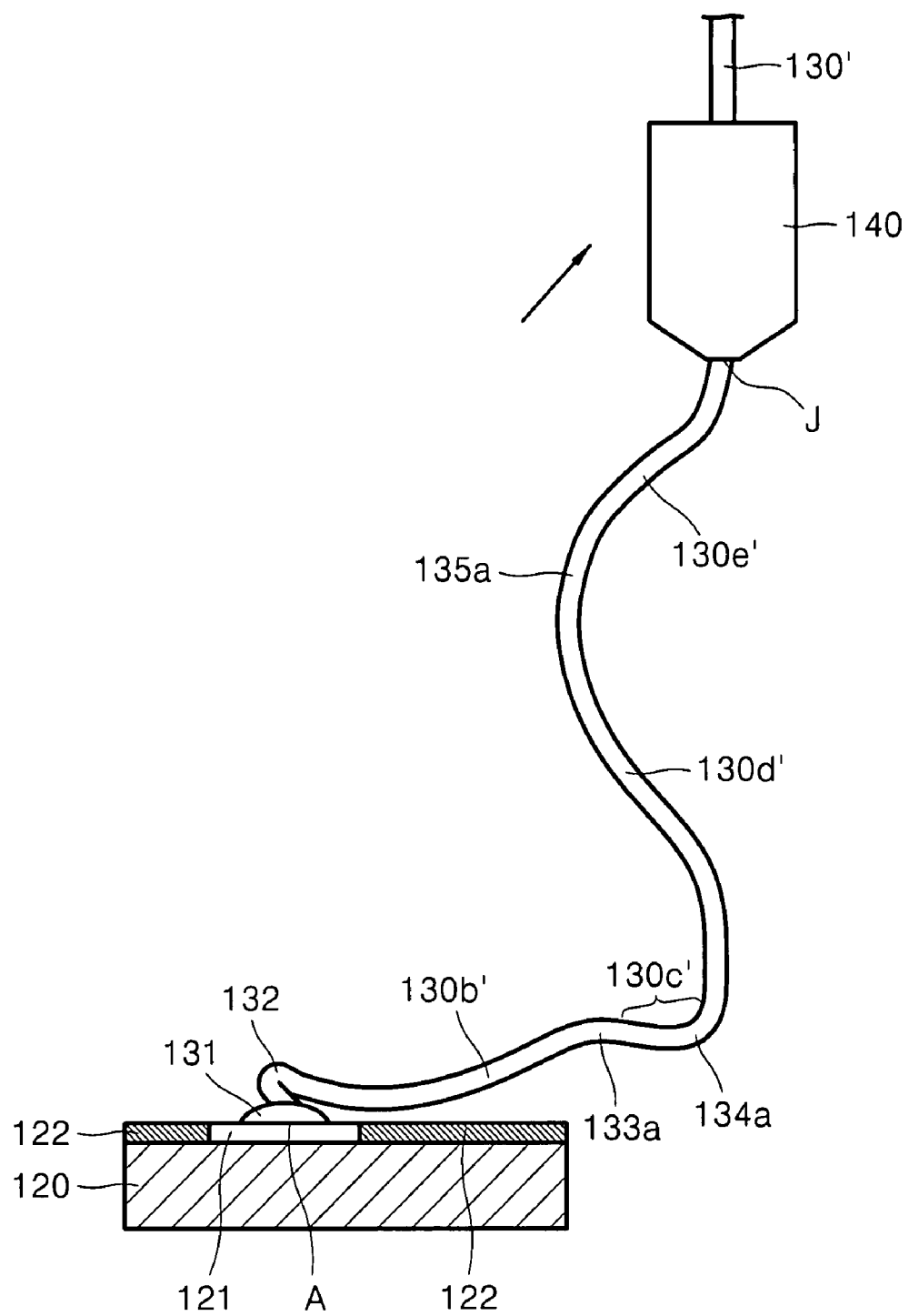

As shown in FIG. 15, the capillary 140 may be moved from loop point H in a generally linear leftward and downward direction to a loop point I to curve or bend the wire material 130d' to result in a generally S-shaped wire material 130d'. Thereafter, as shown in FIG. 16, the capillary 140 may be moved from loop point I in a generally linear rightward and upward direction to a loop point J to form the third curved part 135a and to additionally expose a wire material 130e' having a predetermined length. As can be appreciated, most of the exposed wire material 130e' corresponds to the fourth wire part 136 (FIG. 5). As will be explained hereinafter, the loop points I and J may be optional (e.g., if it is not desired to form third and fourth wire parts 135, 136, or a third wire part 135, 235 with first and second portions) and, therefore, the foregoing-described steps may be omitted from the method.

Figure 17:
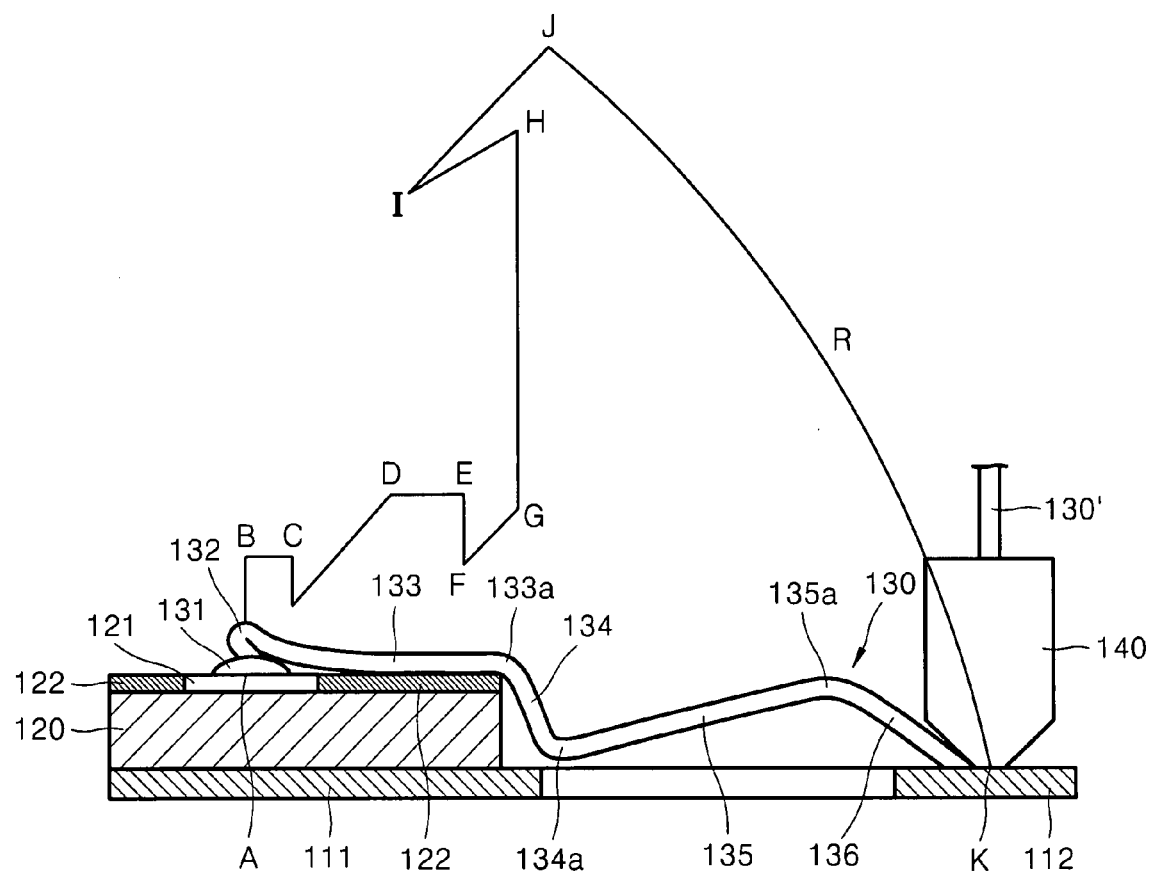

In a state illustrated in FIG. 16 (loop point J), the wire material 130' is substantially prevented from being further fed or extended from the capillary 140. For example, the material 130' may be clamped using a wire clamp. Then, the capillary 140 is moved from loop point J to an upper part of the lead 112 along an arcuate route R (see FIG. 17). Thereafter, (e.g., when the wire clamp is released) the wire material 130' is pressed at the second bonding point K to perform the second bonding as shown in FIG. 17. For example, a predetermined heat may be applied to a part of the wire material 130' on which the second bonding is to be performed, and then the heated part of the wire material 130' may be pressed to the lead 112 to perform the second bonding.

The completed wire loop 130 is shown in FIG. 17 along with a movement path of the capillary 140 defined by loop points A, B, C, D, E, F, G, H, I, and J and the arcuate route R.

Although operation of clamping the wire material 130' has been described relative to the arcuate movement (route R) of the capillary 140 in the description of the process of forming the wire loop 130, clamping may occur relative to other movements of the capillary 140 so long as material properties (e.g., strength, hardness, etc.) of the wire material 130' are not substantially changed. However, according to the present embodiment, the wire clamp does not operate in the processes described with reference to FIGS. 6 through 16. Thus, the processes described with reference to FIGS. 6 through 16 are performed so as to expose, feed or otherwise extend the wire material 130' from the capillary 140. In other words, according to the present embodiment, the wire clamp operates to clamp the wire material 130' only in a part in which the capillary 140 moves along the route R shown in FIG. 17. Thus, the wire material 130' is additionally not exposed during arcuate movement of the capillary 140. However, the operation of the wire clamp according to the present invention is not limited to this. For example, in the processes described with reference to FIGS. 6 through 16, the wire clamp may operate if required.

As described above, the wire loop 130 of the present embodiment includes the first, second, and third curved parts 133a, 134a, and 135a so that the first wire part 133 contacts the upper surface of the semiconductor chip 120 and the rigidity of the wire loop 130 increases. As a result, the wire loop 130 is less affected by a repelling force so that the wire loop 130 having a low height can be stably realized.

Figure 18:
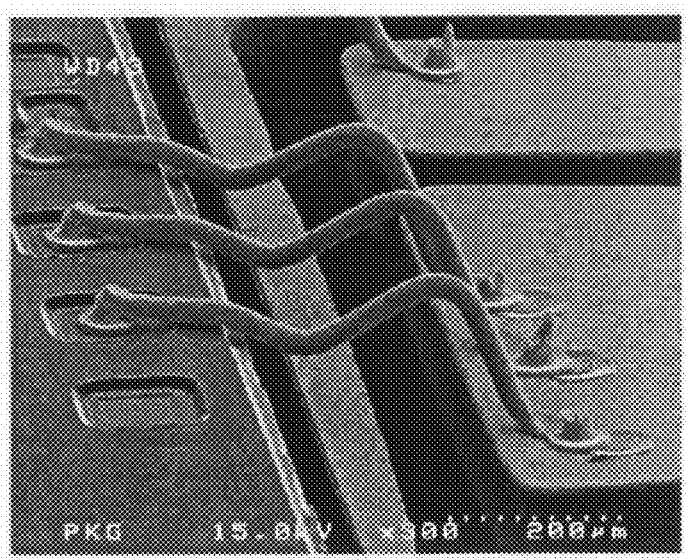
FIG. 18 illustrates a portion of a semiconductor package adopting a first embodiment of a wire loop made according to an aspect of the present invention.

FIG. 18 illustrates an example semiconductor package adopting a first embodiment of the wire loop 130 according to an aspect of the present invention. As shown in FIG. 18, the first wire part contacts the upper surface of the semiconductor chip and a height of the wire loop is kept low. In other words, in this case, the height of the wire loop can be within a range between about 25 μm and about 35 μm. Thus, an internal space of the semiconductor package can be fully utilized. Also, a volume of the semiconductor package can be considerably reduced.

In particular, in a multi-chip package (MCP) including a stack of different semiconductor chips, clearance between wires may be a challenge. Thus, by employing the wire loops 130, 230, short-circuits in such packages may be prevented from occurring between adjacent wires. Also, the wire loops 130, 230 having low heights may additionally prevent short-circuits from occurring between a lower surface of an upper semiconductor chip stacked on a bonded lower semiconductor chip and the wires.

A structure of a semiconductor package including a wire loop according to another embodiment of the present invention will now be described with reference to FIGS. 19 and 20.

Figure 19:
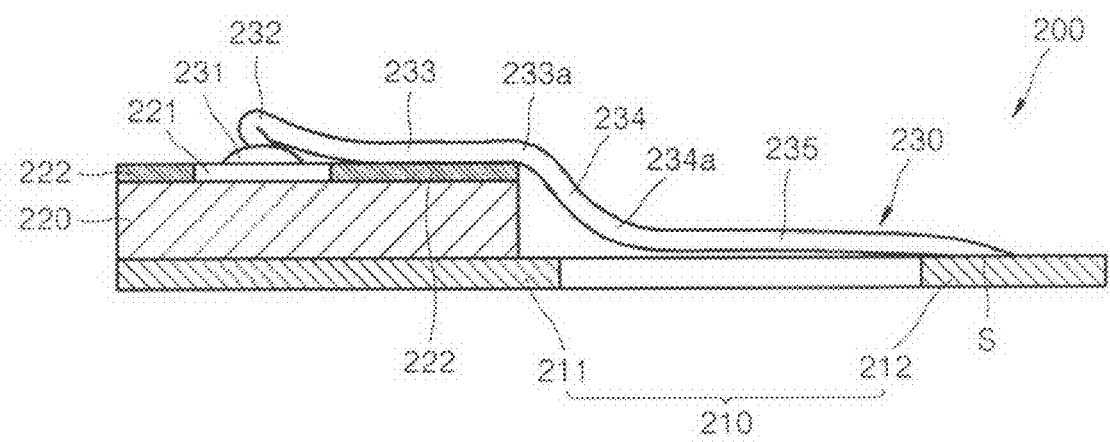
FIG. 19 is a cross-sectional elevation view illustrating a portion of a semiconductor package with another embodiment of a wire loop.
Figure 20:
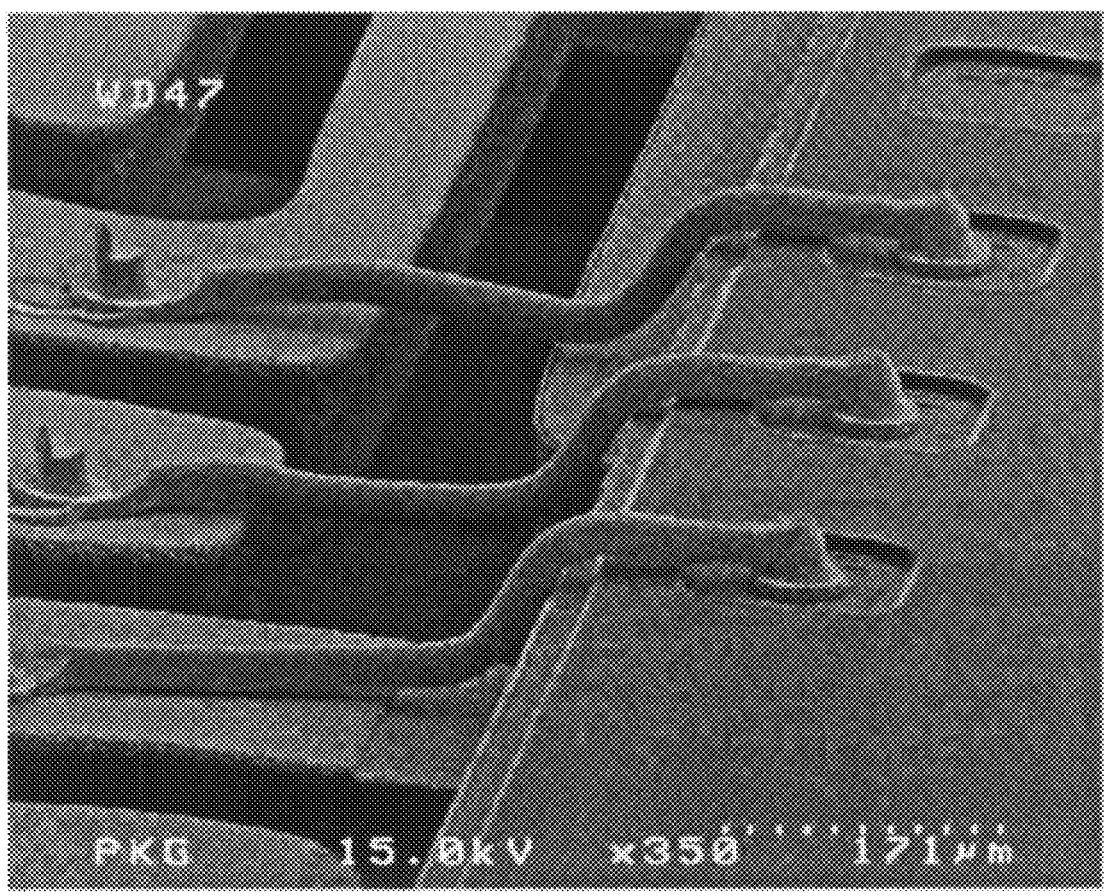
FIG. 20 illustrates a portion of a semiconductor package adopting a wire loop according to another embodiment of the present invention.

FIG. 19 is a cross-sectional elevation view illustrating a portion of a semiconductor package with a wire loop made according to another method, and FIG. 20 illustrates an example semiconductor package adopting such a wire loop.

As shown in FIG. 19, a semiconductor package 200 according to the current embodiment of the present invention includes a lead frame 210, a semiconductor chip 220, and a wire loop 230.

The lead frame 210 includes a die pad 211 and a plurality of leads 212. The semiconductor chip 220 is disposed on the die pad 211.

A plurality of electrode pads 221 are configured about a perimeter of an upper surface of the semiconductor chip 220. An insulator 222 may be disposed on parts of the upper surface of the semiconductor chip 220 on which the electrode pad 221 is not formed.

The insulator 222 may be formed on the semiconductor chip 220. However, the present invention is not limited to this configuration. In other words, according to the present invention, if a wire material constituting a first wire part (e.g., a portion of part 233 shown in FIG. 19) is coated with an insulating material, the illustrated insulator 222 may not be included.

The wire loop 230 includes a ball 231, a pressed part 232, first wire part 233, second wire part 234 and third wire part 235.

Similar to the previously described wire loop 130, the ball 231 of wire loop 230 is bonded on an upper surface of the electrode pad 221, and a portion of the wire proximate to the ball 231 is pressed to fold or overlap two parts so as to form the pressed part 232 on the ball 231. Here, shapes of ball 231 and the pressed part 232 and a method of forming a route of a capillary may be substantially similar as the shapes of the ball 131 and the pressed part 132 and the method of forming the route of the capillary 140 (i.e., loop points A, B and C). Thus, their detailed descriptions will not be repeated for brevity.

The first wire part 233 extends substantially horizontally from the pressed part 232, and at least a portion of the first wire part 233 contacts the insulator 222 on the semiconductor chip 220.

The second wire part 234 extends at a downward incline from the first wire part 233 and is connected to the first wire part 233 through a first curved part 233a. Although the first and second wire parts 233, 234 are described as being connected, it should be appreciated that the parts 233, 234 may be integrally formed, continuous or otherwise unitary.

Here, shapes of the first and second wire parts 233 and 234 and the first curved part 233a and the method of forming the route of the capillary may be substantially similar as the shapes of the first and second wire parts 133 and 134 and the first curved part 133a and the method of forming the route of the capillary 140. Thus, their detailed descriptions will not be repeated for brevity.

The third wire part 235 extends at a downward incline from the second wire part 234 and is connected to the second wire part 234 through a second curved part 234a. Also, an end of the third wire part 235 is bonded to one of the leads 212 at a second bonding point S. Although the second and third wire parts 234, 235 are described as being connected, it should be appreciated that the parts 234, 235 may be integrally formed, continuous or otherwise unitary.

The third wire part 235 according to the present embodiment inclines downward from the second wire part 234. However, the present invention is not limited to this. In other words, according to the present invention, the third wire part 235 does not need to incline downward from the second wire part 234. For example, the third wire part may extend substantially horizontally from the second wire part 234.

Here, the shape of the third wire part 235 and the method of forming the route of the capillary are different from the shape of the third wire part 135. The different shapes are due to different steps being performed or steps being omitted from the previously-described method of forming the route of the capillary 140 (see FIG. 17). More particularly, a process of forming the third wire part 235 does not include the steps shown in FIGS. 15 and 16 (i.e., moving the capillary 140 to the left and right to form the third curved part 135a). Instead, the process for making the current embodiment wire loops 230 includes a process of moving the wire material from a position as shown in FIG. 14 to the second bonding point S on an upper surface of the lead 212 along a route similar to arcuate route R shown in FIG. 17 and bonding the wire material to the lead 212. As can be appreciated, from FIG. 17, in the present embodiment of the method, the loop points I and J are omitted.

FIG. 20 illustrates an example semiconductor package adopting a second embodiment of the wire loop 230. As shown in FIG. 20, the first wire part contacts the upper surface of the semiconductor chip, and a height of the wire loop is kept low.

As described above, the wire loop 230 of the semiconductor package 200 according to the present embodiment includes the first and second curved parts 233a and 234a. Thus, since the first wire part 233 contacts the upper surface of the semiconductor chip 220, the rigidity and stability of the wire loop 130 may be increased due to the part 233 being supported by the chip 220. As a result, the wire loop 230 is less affected by a repelling force so that the wire loop 230 having a low height can be stably realized.

Also, in a MCP, clearance between wires can be secured to prevent short-circuits from occurring between the wires. In addition, a wire loop having a low height can be formed to prevent short-circuits from occurring between a lower surface of an upper semiconductor chip stacked on a bonded lower semiconductor chip and the wires in a MCP.

The structure, operation, and effect of a semiconductor package according to the present embodiment are substantially similar as those of a semiconductor package according to the previous embodiment. Thus, their detailed descriptions are not repeated for brevity.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a wire loop for a semiconductor package including a semiconductor chip with a plurality of electrode pads and a lead frame with a plurality of leads, the method comprising:
   a) bonding a ball end of a wire on an electrode pad of the plurality of electrode pads;
   b) forming a pressed part on an upper surface of the ball;
   c) extending the wire a first predetermined distance from the pressed part;
   d) bending a first portion of the wire proximate to an end of the first predetermined distance so that a curve of the first portion is oriented away from the semiconductor chip;
   e) extending the wire a second predetermined distance from the first portion;
   f) bending a second portion of the wire proximate to an end of the second predetermined distance so that a curve of the second portion is oriented opposite to the curve of the first portion;
   g) extending the wire a third predetermined distance from the second portion;
   h) arcuately moving a third portion of the wire proximate to an end of the third predetermined distance so that a section of the wire between the pressed part and the first portion is substantially horizontal and contacting an upper surface of the semiconductor chip; and
   i) connecting the third portion to a lead of the plurality of leads.

2. The method of claim 1 wherein step b) further comprises:
   folding a portion of the wire proximate to the ball onto itself to form an overlapped wire portion; and
   pressing the overlapped wire portion onto the upper surface of the ball.

3. The method of claim 2 wherein the folding step comprises:
   first moving a capillary, which feeds the wire, linearly in a first direction that is generally perpendicular to the upper surface of the semiconductor chip and away from the upper surface;
   second moving the capillary linearly in a second direction that is generally perpendicular to the first direction and toward the lead; and
   third moving the capillary linearly in a third direction that is substantially opposite to the first direction.

4. The method of claim 1 wherein step h) further comprises the step of clamping the wire to prevent extension of the wire from a capillary that is arcuately moving the wire.

5. The method of claim 1 further comprising the step of configuring an insulator between the upper surface and the section of the wire between the pressed part and the first portion.

6. The method of claim 5 wherein the configuring step comprises disposing an insulating material on the upper surface.

7. The method of claim 1 wherein step g) further comprises:
   bending a third portion of the wire proximate to an end of the third predetermined distance so that a curve of the third portion is oriented similarly to the curve of the first portion; and
   extending the wire a fourth predetermined distance from the third portion.

8. The method of claim 7 wherein the step of bending the third portion comprises:
   first moving a capillary, which feeds the wire, linearly in a forward direction defined by a first acute angle relative to the upper surface; and
   second moving the capillary linearly in a reverse direction defined by a second acute angle relative to the upper surface, wherein the first and second acute angles are different from each other.

9. A method of forming a semiconductor package comprising:
   a) configuring a semiconductor chip with a plurality of bonding pads on a die pad of a lead frame including a plurality of leads;
   b) bonding a ball end of a wire on an electrode pad of the plurality of electrode pads;
   c) forming a pressed part on an upper surface of the ball;
   d) extending the wire a first predetermined distance from the pressed part;
   e) bending a first portion of the wire proximate to an end of the first predetermined distance so that a curve of the first portion is oriented away from the semiconductor chip;
   f) extending the wire a second predetermined distance from the first portion;
   g) bending a second portion of the wire proximate to an end of the second predetermined distance so that a curve of the second portion is oriented opposite to the curve of the first portion;
   h) extending the wire a third predetermined distance from the second portion;
   i) arcuately moving a third portion of the wire proximate to an end of the third predetermined distance so that a section of the wire between the pressed part and the first portion is substantially horizontal and contacting an upper surface of the semiconductor chip; and
   j) connecting the third portion to a lead of the plurality of leads.

10. The method of claim 9 wherein step c) further comprises:
    folding a portion of the wire proximate to the ball onto itself to form an overlapped wire portion; and
    pressing the overlapped wire portion onto the upper surface of the ball.

11. The method of claim 10 wherein the folding step comprises:
    first moving a capillary, which feeds the wire, linearly in a first direction that is generally perpendicular to the upper surface of the semiconductor chip and away from the upper surface;
    second moving the capillary linearly in a second direction that is generally perpendicular to the first direction and toward the lead; and
    third moving the capillary linearly in a third direction that is substantially opposite to the first direction.

12. The method of claim 9 wherein step i) further comprises the step of clamping the wire to prevent extension of the wire from a capillary that is arcuately moving the wire.

13. The method of claim 9 further comprising the step of configuring an insulator between the upper surface and the section of the wire between the pressed part and the first portion.

14. The method of claim 9 wherein step h) further comprises:
  bending a third portion of the wire proximate to an end of the third predetermined distance so that a curve of the third portion is oriented similarly to the curve of the first portion; and
  extending the wire a fourth predetermined distance from the third portion.

15. The method of claim 14 wherein the step of bending the third portion comprises:
  first moving a capillary, which feeds the wire, linearly in a forward direction defined by a first acute angle relative to the upper surface; and
  second moving the capillary linearly in a reverse direction defined by a second acute angle relative to the upper surface, wherein the first and second acute angles are different from each other.

* * * * *